(12) United States Patent
Carcasi et al.

(10) Patent No.: US 9,746,774 B2
(45) Date of Patent: **\*Aug. 29, 2017**

(54) MITIGATION OF EUV SHOT NOISE REPLICATING INTO ACID SHOT NOISE IN PHOTO-SENSITIZED CHEMICALLY-AMPLIFIED RESIST (PS-CAR)

(71) Applicant: Tokyo Electron Limited, Minato-ku, Tokyo (JP)

(72) Inventors: Michael A. Carcasi, Austin, TX (US); Mark H. Somervell, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/628,542

(22) Filed: Feb. 23, 2015

(65) Prior Publication Data

US 2015/0241781 A1 Aug. 27, 2015

Related U.S. Application Data

(60) Provisional application No. 61/944,044, filed on Feb. 24, 2014.

(51) Int. Cl.
*G03F 7/20* (2006.01)
*G03F 7/40* (2006.01)

(52) U.S. Cl.
CPC ............. *G03F 7/2022* (2013.01); *G03F 7/40* (2013.01); *G03F 7/2002* (2013.01)

(58) Field of Classification Search
CPC ................................ G03F 7/2022; G03F 7/40
See application file for complete search history.

(56) References Cited

U.S. PATENT DOCUMENTS 6,844,135 B2 1/2005 Kon et al.
7,829,269 B1 11/2010 Fonseca et al.
(Continued)

FOREIGN PATENT DOCUMENTS

| JP | 2015172741 A | 10/2015 |
|---|---|---|
| WO | 2013007442 A1 | 1/2013 |
| WO | 2005013007 A1 | 2/2015 |

OTHER PUBLICATIONS

International Searching Authority, Search Report and Written Opinion issued in corresponding International Application PCT/US2015/017056, dated May 29, 2015, 10 pp.
(Continued)

*Primary Examiner* — Kathleen Duda
(74) *Attorney, Agent, or Firm* — Wood Herron & Evans LLP

(57) ABSTRACT

A method for mitigating shot noise in extreme ultraviolet (EUV) lithography and patterning of photo-sensitized chemically-amplified resist (PS-CAR) is described. The method includes a first EUV patterned exposure to generate a photosensitizer and a second flood exposure at a wavelength different than the wavelength of the first EUV patterned exposure, to generate acid in regions exposed during the first EUV patterned exposure, wherein the photosensitizer acts to amplify acid generation and improve contrast. The resist may be exposed to heat, liquid solvent, solvent atmosphere, or a vacuum to mitigate the effects of EUV shot noise on photosensitizer concentration which may accrue during the first EUV patterned exposure.

22 Claims, 4 Drawing Sheets

(56) References Cited

U.S. PATENT DOCUMENTS

| | | | |
|---|---|---|---|
| 9,519,227 B2* | 12/2016 | Carcasi | G03F 7/2022 |
| 2004/0152024 A1* | 8/2004 | Livesay | G03F 7/38 |
| | | | 430/394 |
| 2010/0245790 A1 | 9/2010 | Seltmann et al. | |
| 2011/0177464 A1 | 7/2011 | Takeda et al. | |
| 2013/0084532 A1* | 4/2013 | Wu | G03F 7/70466 |
| | | | 430/325 |
| 2013/0234294 A1 | 9/2013 | Hu et al. | |
| 2013/0260313 A1 | 10/2013 | Allen et al. | |
| 2016/0357103 A1 | 12/2016 | Nagahara et al. | |

OTHER PUBLICATIONS

International Searching Authority, Search Report and Written Opinion issued in related International Application PCT/US2015/017071 dated May 29, 2015, 13 pp.

S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.

S. Tagawa, et al., "New Sensitization Method of Chemically Amplified EUV/EB Resists," presented at the 2013 International Symposium on EUV Lithography. Toyama, Japan Oct. 6-10, 2013.

A. Ravve, "Light-Associated Reactions of Synthetic Polymers", Springer Science-Business Media, ISBN 0387318038, pp. 23-25, 2006.

International Bureau of WIPO, International Preliminary Report on Patentability issued in corresponding International Application No. PCT/US2015/017056 dated Aug. 30, 2016, 7 pp.

International Bureau of WIPO, International Preliminary Report on Patentability issued in related International Application No. PCT/US2015/017071 dated Aug. 30, 2016, 10 pp.

Japan Patent Office, Official Action issued in corresponding d JP Patent Application No. 2016-553436 dated May 23, 2017, 18 pp., including English translation.

\* cited by examiner

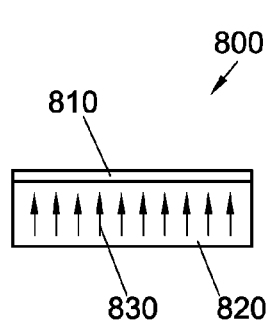
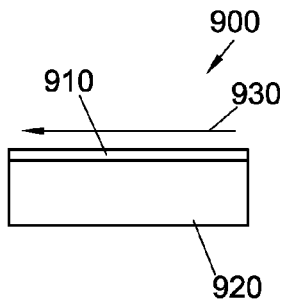
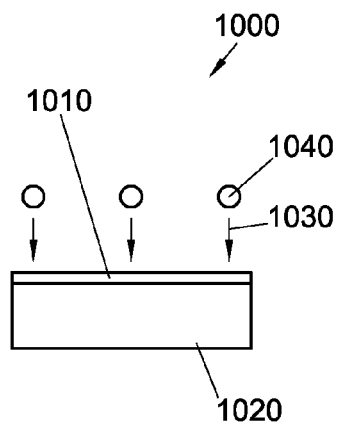
FIG. 5A  FIG. 5B  FIG. 5C
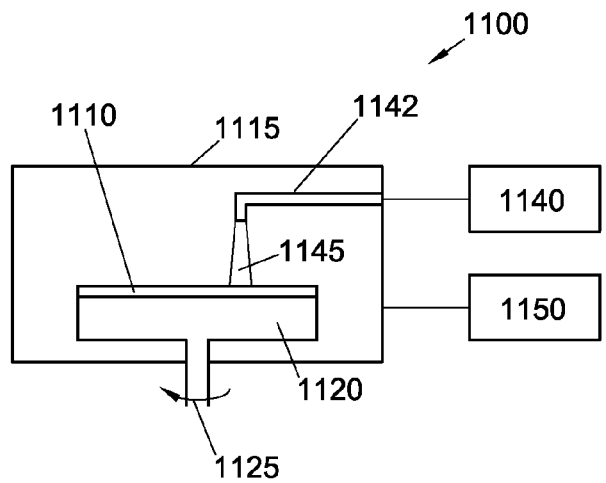
FIG. 6
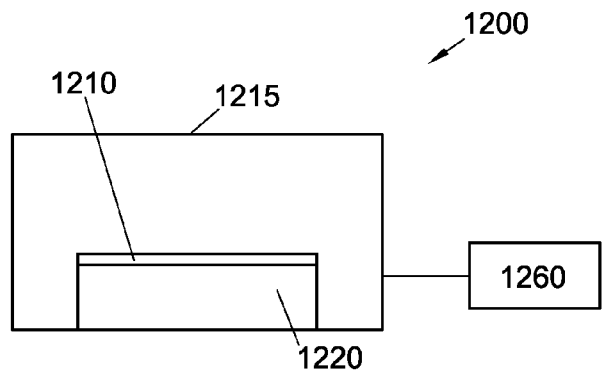
FIG. 7

MITIGATION OF EUV SHOT NOISE REPLICATING INTO ACID SHOT NOISE IN PHOTO-SENSITIZED CHEMICALLY-AMPLIFIED RESIST (PS-CAR)

CROSS REFERENCE TO RELATED APPLICATIONS

This application is based on and claims the benefit of and priority to U.S. Provisional Patent Application No. 61/944,044, entitled "MITIGATION OF EUV SHOT NOISE REPLICATING INTO ACID SHOT NOISE IN PHOTO-SENSITIZED CHEMICALLY AMPLIFIED RESIST (PS-CAR)" (Ref. No. CT-121PROV), filed on Feb. 24, 2014, the entire contents of which are herein incorporated by reference.

BACKGROUND OF THE INVENTION

Field of the Invention

The present invention relates to a method for patterning in semiconductor manufacturing. Specifically, it relates to EUV shot noise mitigation methods to be applied in patterning (lithography) that utilizes Photo-Sensitized Chemically-Amplified resist (PS-CAR).

Description of Related Art

In lithographic patterning of semiconductor devices, shrinking technology nodes, and thus feature sizes are driving wavelengths into the extreme ultraviolet (EUV) range. At this time, EUV light sources are still under active development, and currently are not capable of developing and delivering the levels of illumination of prior generations of light sources. To address these shortcomings and still be able to utilize the current generation of EUV light sources, a resist chemistry and associated methods have been developed, called Photo-Sensitized Chemically-Amplified resist (PS-CAR). PS-CAR, like traditional Chemically-Amplified resist (CAR), utilizes acid generated within the resist feature for deprotection, but acid is generated in a two-step illumination process, unlike CAR where only a single patterned exposure is used.

In PS-CAR, a first EUV patterned exposure is used to generate a pattern (latent image within the resist) with a relatively small amount of generated acid, and at the same time generate a photosensitizer (PS) compound, for example from a photosensitizer generator added to the PS-CAR resist. Both the acid and photosensitizer (PS) are generated only in illuminated portions of the PS-CAR resist, during the first EUV patterned exposure. Thereafter, a second flood exposure is performed, i.e. with no pattern, at a second wavelength of light different than the wavelength of the first EUV exposure. The PS-CAR resist chemistry is chosen such that the photosensitizer (PS) is sensitive to the second wavelength of light used in the second flood exposure, while other resist components are not. The photosensitizer (PS), wherever present in the pattern formed during the first EUV patterned exposure causes further generation of acid during the second flood exposure, with tenfold increases of acid concentration, for example, being typical. This photosensitizer-induced acid concentration increase results in greatly increased contrast, which allows more process latitude particularly with respect to the RLS tradeoff (Resolution-Line Width Roughness-Sensitivity). Thus, PS-CAR presents an enabling technology for EUV lithography because it allows the productive use of EUV sources and lithography at their present power levels.

It should be noted here that PS-CAR processes may involve additional steps, for example between the first EUV patterned exposure and the second flood exposure. The above description was simplified for purposes of clarity. Also, in some PS-CAR chemistry embodiments, no acid may be generated during the first EUV patterned exposure, and only photosensitizer (PS) may be generated, which generated photosensitizer (PS) causes generation of all acid during the second flood exposure. Alternatively yet, acid may be generated in small quantities, as explained before, but it may be effectively consumed by competing chemical reactions, such as quenching events (depending on the amount of quencher present in the PS-CAR resist).

Because the power levels of EUV sources are so low, and because EUV photons each have a relatively high energy due to the short EUV light wavelength, there are relatively fewer photons involved in the patterned EUV exposure (for the same exposure dose) than when longer wavelength light sources are used (e.g. ArF, KrF, etc.) This means that there will be fewer acid molecules generated, for example, in a traditional chemically-amplified resist (CAR). As the EUV exposure dose is decreased, the stochastic probability increases of a photoacid generator (PAG) molecule not being decomposed into acid within a given volume, leading to uneven acid concentration within the resist—an effect collectively known as shot noise. Shot noise is known to be one of the major causes of line width roughness (LWR) in patterning. Depending on the feature type, other parameters such as line edge roughness (LER) or contact edge roughness (CER) may also be affected, where applicable.

Shot noise can also manifest itself during the first EUV patterned exposure of the PS-CAR process, both in an uneven acid concentration and in an uneven photosensitizer (PS) concentration. Further amplification of these uneven concentrations of acid and/or photosensitizer (PS) during the subsequent second flood exposure would lead to degradation of process performance, with line width roughness (LWR) being severely affected (or LER or CER depending on the feature type). Therefore, the need exists for methods to mitigate shot noise, specific to PS-CAR lithography and patterning.

SUMMARY OF THE INVENTION

An aspect of the invention includes a method for treating a substrate, comprising: receiving the substrate, the substrate comprising an underlying layer on the substrate, and a radiation-sensitive material layer on the underlying layer, the radiation-sensitive material layer comprising: a first light wavelength activation threshold that controls the generation of acid to a first acid concentration in the radiation-sensitive material layer and controls generation of photosensitizer (PS) molecules in the radiation-sensitive material layer; and a second light wavelength activation threshold that can excite the photosensitizer (PS) molecules in the radiation-sensitive material layer that results in the acid comprising a second acid concentration that is greater than the first acid concentration, the second light wavelength being different from the first light wavelength; exposing a first wavelength of light through a patterned mask onto the radiation-sensitive material layer, the first wavelength of light comprising a wavelength in the EUV spectrum; diffusing photosensitizer (PS) molecules generated within the radiation-sensitive material layer during the step of exposing a first wavelength of light though a patterned mask, to reduce the nonuniformity due to EUV shot noise in the radiation-sensitive material layer; and flood exposing a second wavelength of light to the radiation-sensitive material layer, the second wavelength of light comprising a wavelength that is different from the first wavelength of light.

In another aspect of the invention, the step of diffusing photosensitizer (PS) molecules generated in the radiation-sensitive material layer may comprise heating the substrate on a hot plate, using a convection heat source, or by exposure to electromagnetic radiation from an electromagnetic radiation source.

Yet another aspect of the invention includes the use of a photoacid generator (PAG) compound with a higher thermal activation energy than the thermal activation energy of the photosensitizer (PS) molecules.

A further aspect of the invention, step of diffusing photosensitizer (PS) molecules generated in the radiation-sensitive material layer may comprise exposing the radiation-sensitive material layer to at least one of a liquid solvent or a solvent vapor, optionally alternating exposures of the radiation-sensitive material layer to the liquid solvent and the solvent vapor.

In a yet further aspect of the invention, the step of diffusing photosensitizer (PS) molecules generated in the radiation-sensitive material layer may comprise exposing the radiation-sensitive material layer to a vacuum environment.

In a yet further aspect of the invention, the step of diffusing photosensitizer (PS) molecules generated in the radiation-sensitive material layer may comprise inducing an increase of volume of the radiation-sensitive material layer by a release of a volatile chemical component of the radiation-sensitive material layer.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 5A,B,C show exemplary embodiments of hot plate substrate heating, convention substrate heating, and heating by exposure to electromagnetic radiation, all in accordance with embodiments of the invention.

FIG. 6 shows an exemplary embodiment of a substrate solvent exposure step in accordance with an embodiment of the invention.

FIG. 7 shows an exemplary embodiment of a substrate vacuum exposure step in accordance with an embodiment of the invention.

DETAILED DESCRIPTION OF EXEMPLARY EMBODIMENTS

Figure 1A:
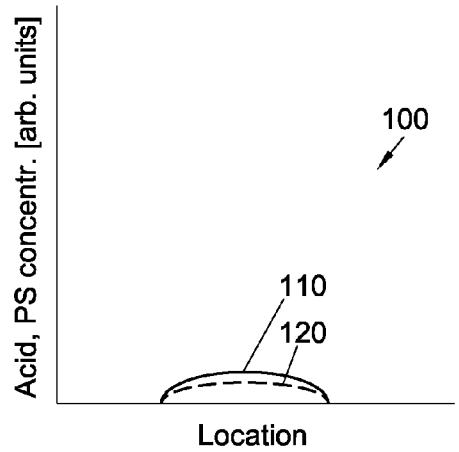
FIGS. 1A and 1B show exemplary photosensitizer and acid concentration profiles, and a device cross section following an EUV patterned exposure step in a PS-CAR patterning process in accordance with an embodiment of the invention.

Embodiments of the present invention relate to design and control of a process, apparatus, and system for patterning a layer on a substrate, in semiconductor manufacturing.

In the following description, in order to facilitate a thorough understanding of the invention and for purposes of explanation and not limitation, specific details are set forth, such as particular geometries of a lithography, coater/developer, exposure tools, and descriptions of various components and processes. However, it should be understood that the invention may be practiced in other embodiments that depart from these specific details.

In the description to follow, the terms radiation-sensitive material and photoresist may be used interchangeably, photoresist being only one of many suitable radiation-sensitive materials for use in photolithography. Similarly, hereinafter the term substrate, which represents the workpiece being processed, may be used interchangeably with terms such as semiconductor wafer, LCD panel, light-emitting diode (LED), photovoltaic (PV) device panel, etc., the processing of all of which falls within the scope of the claimed invention.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Furthermore, the use of photo-sensitized chemically-amplified resist (PS-CAR) is not limited only to resist (photoresist), but similar light-sensitive chemistries can be implemented in antireflective coatings (ARC), bottom antireflective coatings (BARC), developer-soluble bottom antireflective coatings (DBARC), etc. It is understood that the PS-CAR chemistries and methods described herein may be applied to all these materials and patterning thereof, and therefore the terms resist, photoresist, and radiation-sensitive material will be used interchangeably hereinafter to refer to all of these materials.

The photo-sensitized chemically-amplified resist (PS-CAR) concept is currently being proposed, for example, by S. Tagawa et al., "Super High Sensitivity Enhancement by Photo-Sensitized Chemically Amplified Resist Process", Journal of Photopolymer Science and Technology, Vol. 26, Number 6 (2013), pp. 825-830 (Tagawa hereinafter). In contrast to traditional resist processing wherein a single patterned exposure (i.e. through a mask) generates regions of de-protected (positive-tone) or protected (negative-tone) resist that define soluble and insoluble regions, respectively, PS-CAR processing relies on a first patterned exposure at a first wavelength of light to amplify sensitivity of the resist to a second chemically-selective flood exposure at a second wavelength of light, which defines the final pattern. The second wavelength of light is chosen to be different than the first wavelength of light. This enables higher sensitivity patterning when photon density is low. The photosensitizer (PS) is created during the first EUV patterned exposure, and only in exposed regions of the resist. Electron beam (eBeam), KrF, or ArF exposure can also be used for the first patterned exposure.

The choice of flood exposure wavelength is dictated by the requirement that the absorption by the photosensitizer (PS) be maximized while minimizing the absorbance by the photo acid generator (PAG) in the resist. Typically, the flood exposure wavelength of light is in the UV portion of the light spectrum. The photosensitizer (PS) excited by the second flood exposure will decompose photoacid generator (PAG) molecules in its vicinity causing amplification of acid generation in regions that were exposed in the first EUV patterned exposure, while essentially maintaining no acid formation in unexposed regions. This means there is no DC-bias shift that is typically present in traditional flood exposure processes.

The resist thus may include a separate activation thresholds that enables the generation of chemicals within the resist to occur at different times under different process conditions, prior to being developed. Specifically, the concept is to isolate the generation of photosensitizer (PS) and acid amplification from one another, within the resist, as described in Tagawa. In some PS-CAR chemistry embodiments, only the photosensitizer and no acid are generated during the first EUV patterned exposure, the acid generation and amplification occurring entirely during the subsequent second flood exposure. In these embodiments, there is no overlap in the light sensitivity ranges of the photosensitizer generator and the photoacid generator (PAG). In other PS-CAR chemistry embodiments, the photosensitizer generator and photoacid generator (PAG) light sensitivity ranges may overlap slightly, such that photosensitizer (PS) is generated concurrently with a relatively small amount of acid, typically less than about half of the final amount of generated acid after amplification, during the first EUV patterned exposure. This initially generated amount of acid is then amplified in the second flood exposure. In exemplary embodiments of PS-CAR, the first (EUV) wavelength of light may be less than 300 nm while the second wavelength of light used for second flood exposure may be greater than 300 nm, typically about 365 nm.

In an embodiment, the resist may include a photosensitizer generator comprising a first light wavelength activation threshold that controls generation of photosensitizer (PS) molecules in the resist layer and a photoacid generation (PAG) compound comprising a second light wavelength activation threshold that controls the generation and amplification of acid in the resist layer, wherein the second activation wavelength is different than the first activation wavelength, as mentioned before. The photosensitizer molecule may be chosen to absorb light energy and transfer the light energy to another molecule, for example a photoacid generator (PAG). Some photosensitizer (PS) molecules may transfer energy in a ground state while other may transfer energy in an excited state. In an embodiment, the photosensitizer generator of PS-CAR resist may comprise at least one of acetophenone, triphenylene, benzophenone, flourenone, anthraquinone, phenanthrene, or derivatives thereof. In an embodiment, the photoacid generator (PAG) may be a cationic photoinitiator that may convert absorbed light energy into chemical energy, for example an acidic reaction. The photoacid generator (PAG) may comprise at least one of triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

Figure 1B:
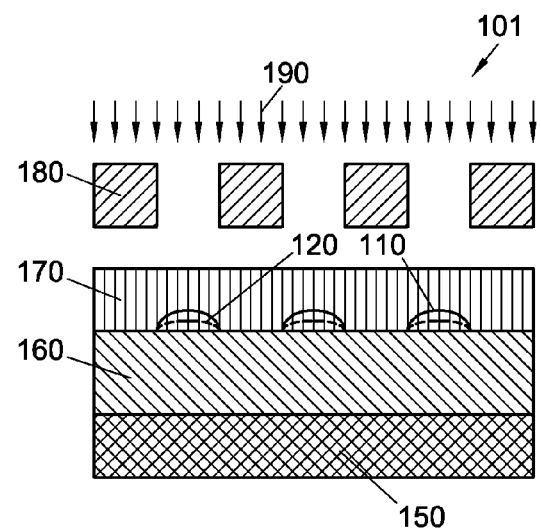

To further assist understanding, FIGS. 1A-D describe the PS-CAR patterning process prior to subsequent development and etching steps. In FIG. 1B, a substrate 150 is provided that is coated or modified to form an underlying layer 160, which is to be patterned. A PS-CAR resist 170 is applied using, for example, spin-on dispense techniques, to the exposed surface of the underlying layer 160. In the first EUV patterned exposure 101, a first wavelength of light 190 is exposed onto the PS-CAR resist 170 through a mask 180, to form alternating exposed and unexposed regions inside PS-CAR resist 170. During this exposure, photosensitizer (PS) is generated from the photosensitizer generator in exposed regions of the PS-CAR resist 170, to form photosensitizer (PS) concentration profiles 120, which are also shown enlarged in FIG. 1A with graphs 100 of photosensitizer (PS) and acid concentrations, 120 and 110, respectively. Depending on the PS-CAR resist chemistry, in some embodiments, acid may also be formed during first EUV patterned exposure 101 from photoacid generators (PAG) molecules inside PS-CAR resist 170, to form acid concentration profiles 110. In other embodiments, where there is no overlap between photosensitizer generator and photoacid generator (PAG) light sensitivity ranges, as described before, no acid is generated during the first EUV patterned exposure 101.

Figure 1C:
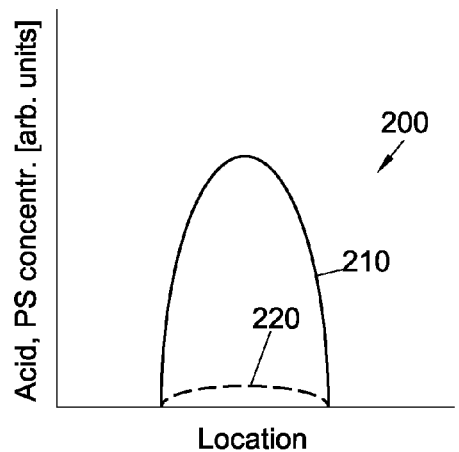
FIGS. 1C and 1D show exemplary photosensitizer and acid concentration profiles, and a device cross section following a flood exposure step in a PS-CAR patterning process in accordance with an embodiment of the invention.
Figure 1D:
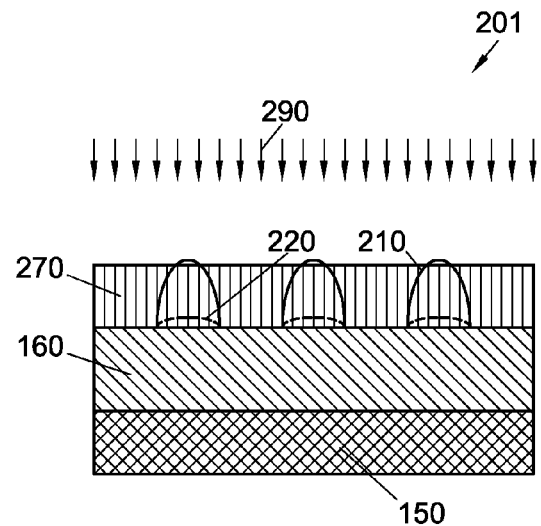

Subsequently, as shown in FIG. 1D, the substrate 150, with underlying layer 160 and pattern-exposed PS-CAR resist 170 is now subjected to a second flood exposure 201 using a second wavelength of light 290 different than the first wavelength of light 190, where the second flood exposure causes photosensitizer (PS) molecules generated in previously exposed (i.e. unmasked) regions to amplify acid generation from photoacid generator (PAG) molecules in their vicinity, thereby forming acid concentration profiles 210. Acid concentration profiles 210 have higher peaks and therefore a better contrast than acid concentration profiles 110 following the first EUV patterned exposure 101. Even though a second flood exposure 201 is involved, unlike in traditional flood exposure processing there is no generation of acid in regions that were unexposed (masked) during the first EUV patterned exposure 101, thus there is no DC-bias and a high contrast is maintained. This is because in PS-CAR acid generation and amplification occur only in the presence of photosensitizer (PS). Typically, photosensitizer (PS) concentration profiles 220 undergo little change after second flood exposure 201 from initial photosensitizer (PS) concentration profiles 120, but in certain chemistry embodiments, larger changes may occur between photosensitizer (PS) concentrations 120 and 220. FIG. 1C shows graphs 200 of photosensitizer (PS) and acid concentration profiles, 220 and 210, respectively, following the second flood exposure 201.

With the amplified acid concentration profiles 210 now present in the PS-CAR resist 170, forming a latent image, the substrate is now ready for subsequent patterning process steps, such as bakes, development, and etching of the underlying layer 160, to complete the patterning process following traditional steps. In some embodiments, additional processing steps may be made between the first EUV patterned exposure 101 and second flood exposure 201, such as baking steps, etc. Furthermore, while the process is described herein using PS-CAR resist 170 as an example, the same process is applicable to any other materials such as ARC, BARC, DBARC, etc. layers including a PS-CAR chemistry.

Figure 2A:
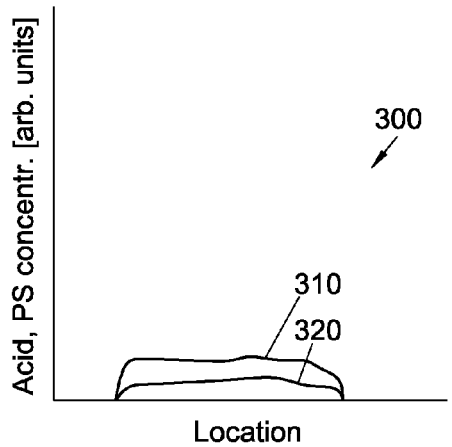
FIGS. 2A and 2B show exemplary photosensitizer and acid concentration profiles prior to and following a flood exposure step, with illustrated effects of unmitigated EUV shot noise in a PS-CAR patterning process in accordance with an embodiment of the invention.
Figure 2B:
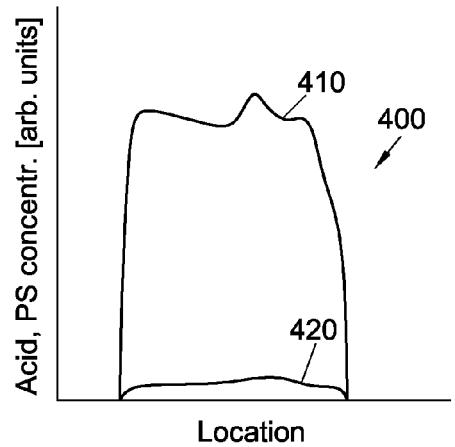

FIGS. 1A-1D showed what ideal photosensitizer (PS) and acid concentration profiles may look like. FIG. 2A shows an exemplary photosensitizer (PS) concentration profile 320 and an acid concentration profile 310 with effects of EUV shot noise accrued during the first EUV patterned exposure 101. EUV shot noise causes a departure from ideal concentration profiles 110 and 120, respectively, of FIG. 1A. If such non-ideal photosensitizer (PS) concentration profile 320 and an acid concentration profile 310 are now subjected to a second flood exposure 201, the second flood exposure 201 may amplify the irregularities of the acid concentration profile 310 into a final acid concentration profile 410, with loss of contrast, as shown in FIG. 2B. The loss of contrast in acid concentration profile 410 is a major contributor to line width roughness (LWR) in patterning (or LER or CER, depending on device type), and measures to mitigate this loss of contrast due to EUV shot noise are required to maintain pattern integrity.

The inventors have conceived of a number of possible ways to mitigate this loss of contrast due to EUV shot noise. Most of these methods are based on including an intermediate step between the first EUV patterned exposure 101 and the second flood exposure 201, in which the generated photosensitizer (PS) is allowed to diffuse within its vicinity, to smooth out the irregularities caused by EUV shot noise. Details of the diffusion processes will be discussed later.

Figure 3A:
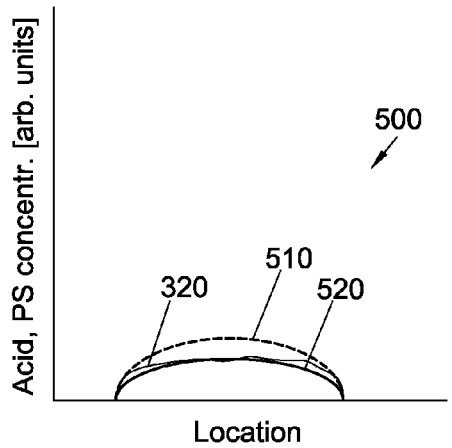
FIG. 3A shows exemplary photosensitizer concentration profiles prior to and following an EUV shot noise mitigation step, and an acid concentration profile following the EUV shot noise mitigation step in a PS-CAR patterning process in accordance with an embodiment of the invention.
Figure 3B:
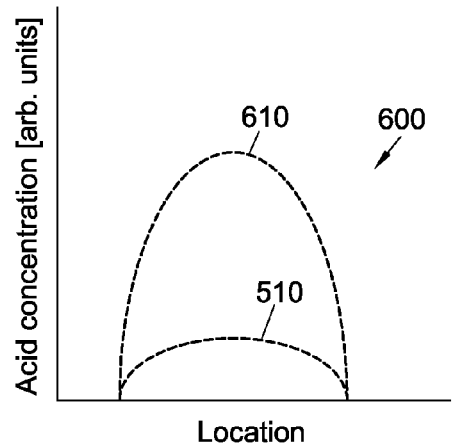
FIG. 3B shows exemplary acid concentration profiles following the EUV shot noise mitigation step and following a flood exposure step in a PS-CAR patterning process in accordance with an embodiment of the invention.

FIG. 3A shows graphs of photosensitizer (PS) concentration profile 320 prior to and photosensitizer (PS) concentration profile 520 following the photosensitizer diffusion step. The photosensitizer (PS) concentration profile 520 is smoother that the EUV shot-noise-affected photosensitizer (PS) concentration profile 320, and should greatly reduce deviations from ideal of the final acid concentration profile. The acid concentration profile 510 after diffusion of photosensitizer (PS) is also shown in FIG. 3A. With the diffused and smoothed photosensitizer (PS) concentration profile 520, the process proceeds with the second flood exposure to generate and amplify the acid. During this process, a final acid concentration profile 610 is reached, as shown in FIG. 3B, which is much improved over the concentration profile 410 of FIG. 2B which is obtained without steps to mitigate EUV shot noise.

Figure 4:
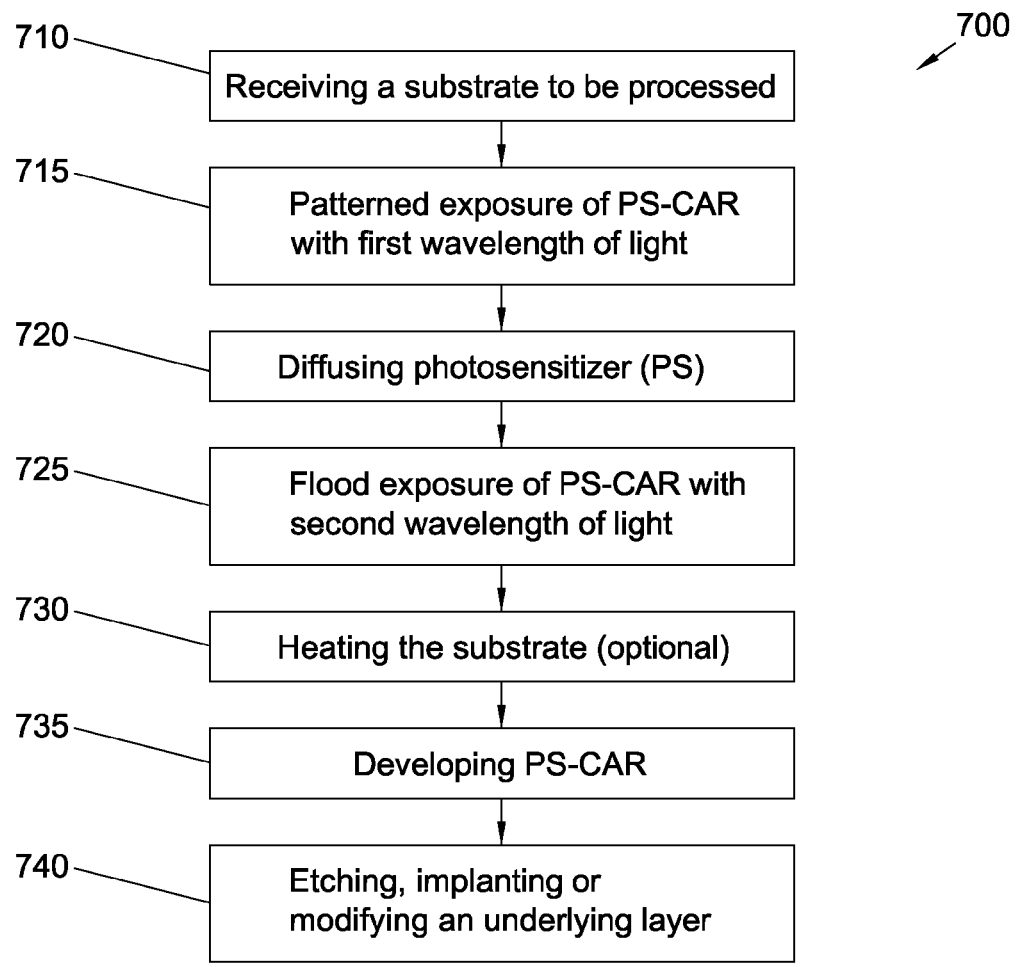
FIG. 4 shows a process flow for a PS-CAR patterning process in accordance with an embodiment of the invention.

With reference now to FIG. 4, therein is shown a flowchart 700 of a PS-CAR patterning process with EUV shot noise mitigation. In step 710, a substrate is provided, such as substrate 150 with underlying layer 160 to be patterned formed thereupon, and a PS-CAR resist 170 deposited atop the underlying layer 160. In step 715, the PS-CAR resist is subjected to a first EUV patterned exposure using a first wavelength of light, typically in the EUV range, thus activating the first activation threshold to generate photosensitizer (PS) from photosensitizer generator present in the PS-CAR resist 170. In step 720, the generated photosensitizer (PS) molecules are allowed to diffuse to mitigate effects of EUV shot noise. In step 725, the PS-CAR resist 170 is subjected to a second flood exposure at a second wavelength of light different than the first wavelength of light, to activate a second activation threshold and cause generation and amplification of acid from photoacid generator (PAG) molecules in the PS-CAR resist 170, to generate a final acid concentration profile corrected for effects of EUV shot noise, as explained before.

With continued reference to FIG. 4, further patterning steps may include traditional patterning steps, such as an optional subsequent bake process 730 during which the substrate is heated, followed by a development process 735 in which the PS-CAR resist 170 is developed to form a patterned mask for subsequent processing of the underlying layer 116. Lastly, the process concludes at the actual process 740 in which the underlying layer 116 is etched, implanted, or modified using developed PS-CAR resist as a mask. All these processes are well known to those skilled in the art of semiconductor lithographic patterning, and will thus not be discussed in detail herein.

In the simplest embodiment, allowing sufficient time between the first EUV patterned exposure and the second flood exposure for the generated photosensitizer (PS) molecules to diffuse represents the simplest embodiment of the step 720 of diffusing photosensitizer (PS) molecules. However, this approach may cause a processing throughput penalty because of substrates held between exposures to allow diffusion to take place.

In other embodiments, the substrate 150 and PS-CAR resist 170 may be heated to accelerate the diffusion step 720. For example, the substrate 150 can be heated to a temperature ranging from about 30° C. to about 130° C., for no more than 120 seconds. In one embodiment shown in FIG. 5A, the substrate 810 is placed on a hot plate 820, and heat 830 is applied to the substrate 810, to effect the diffusion of photosensitizer (PS) 720. In a lithographic track system, this can be done in a traditional bake module 800 equipped with a hot plate 820.

In another embodiment, shown in FIG. 5B, a convection heating module 900 may be utilized to heat the substrate 910 placed on substrate holder 920, by streaming a heated fluid 930 over the surface of the substrate 910.

In yet another embodiment, shown in FIG. 5C, a radiation heating module 1000 may be utilized to heat the substrate 1010 placed on substrate holder 1020, using one or more electromagnetic (EM) radiation sources 1040 to direct irradiation 1030 to the substrate 1010 to effect the heating. EM radiation sources may include visible, UV, infrared, or microwave radiation sources, or a combination thereof. The EM radiation sources may include broadband flash lamps, a light emitting diodes; lasers, ultraviolet (UV) flash lamps, or microwave sources. The substrate 1010 may be scanned under the EM radiation sources 1040, or the sources may be scanned themselves, or both, to achieve a uniform EM exposure and substrate heating.

Since a PS-CAR resist heating has the potential to induce diffusion, deprotection, and quencher events of the acid generated by the first EUV patterned exposure, it has the potential to affect ultimate resolution and sensitivity. For example, the temperature and duration of heating need to be optimized such that a balance is found between deleterious acid diffusion (i.e. of acid generated in the first EUV patterned exposure) and beneficial diffusion of photosensitizer (PS) to mitigate EUV shot noise and improve line width roughness (LWR).

In a further embodiment which improves on the embodiments of diffusing photosensitizer (PS) by heating the PS-CAR resist, the photosensitizer (PS) chemistry can be selected for a low thermal activation energy, while the selected acid chemistry would require a higher thermal activation energy. One possible way to establish this relationship is to use a relatively-low molecular weight photosensitizer (PS), which has a small thus more mobile molecule; and conversely a relatively-high molecular weight acid generated from the photoacid generator (PAG). With such a relationship, the relatively high mobility of the photosensitizer (PS) would allow sufficient diffusion in a relatively mild bake process, for example at temperatures ranging from about 30° C. to about 70° C., without much affecting the acid concentration profile, thus not causing loss of resolution due to diffusion of acid created by first EUV patterned exposure while still very effectively mitigating EUV shot noise by diffusing the photosensitizer (PS).

In another embodiment of diffusing photosensitizer (PS), the photosensitizer (PS) chemistry can be selected to have a volatile component that will volatilize during photosensitizer (PS) formation thus creating a gaseous by-product that will temporarily and locally increase free volume around the photosensitizer reaction site allowing the photosensitizer (PS) to diffuse over a small local distance before the gaseous by-product evolves from the PS-CAR resist. This embodiment reduces the chance of acid deprotection events and loss of resolution and sensitivity, because there is no heating involved and thus no thermal driver for acid deprotection events.

In yet another embodiment of diffusing photosensitizer (PS), shown in FIG. 6, the substrate 1110 is exposed to a liquid solvent 1145 or a solvent vapor (not shown), or both, in order to temporarily increase free volume within the PS-CAR resist to allow diffusion of photosensitizer (PS) to mitigate EUV shot noise. A solvent exposure module 1100, such as one provided on photolithographic track systems is equipped with a substrate holder 1120 configured to receive the substrate 1110. Liquid solvent supplied by liquid solvent supply unit 1140 can be dispensed or sprayed from a nozzle 1142 onto substrate 1110, which can be made to optionally rotate during such dispensing or spraying using rotation means 1125. For solvent vapor exposure, an enclosure 1115 is provided into which solvent vapor (not shown) is fed from a solvent vapor supply unit 1150. In an embodiment, the substrate can be alternately exposed to both liquid solvent and solvent vapor, wherein such cyclical exposure reduces the overall (permanent) swelling of the PS-CAR resist, while allowing multiple opportunities for the photosensitizer (PS) to diffuse during the multiple exposures to liquid solvent, thereby mitigating EUV shot noise.

Examples of solvents that can be used in vapor form include: n-methylpyrrolidone (NMP), dimethyl sulfoxide (DMSO), and dipropylene glycol dimethyl ether, isopropanol, or a mixture of two or more thereof. Example solvents that can be used in liquid form include: propylene glycol monomethyl ether acetate (PGMEA), cyclohexanone, gamma butyrolactone, methyl amyl ketone, ethyl lactate, n-butyl acetate, methyl isobuytl ketone (MIBK), anisole, 2-heptanone, and an aqueous solution of tetra-methyl ammonium hydroxide (TMAH), water, methanol, 4-methyl-2-pentanol, isopropanol, ethanol, propanol, butanol, or a mixture of two or more thereof.

Simultaneous with the solvent exposure, the substrate 1110 can also be heated to a temperature from about 20° C. to about 100° C., to further assist the photosensitizer (PS) diffusion process. Heating can be achieved by means of heaters embedded in substrate holder 1120, or more generally any of the heating means shown in FIGS. 5A-C. The solvent vapor pressure can be maintained at about 5 mTorr to about 100 mTorr, during the process, using a vacuum pump (not shown) connected to enclosure 1115. In another embodiment, the solvent vapor pressure may be maintained at the saturated vapor pressure for the selected solvent at the selected temperature for the process.

In yet another embodiment, vacuum exposure alone may be used to induce the creation of a free volume for diffusion of photosensitizer (PS) within the PS-CAR resist, as shown in FIG. 7. A vacuum module 1200 is used to enclose a substrate 1210 mounted on a substrate holder 1220 inside an enclosure 1215, and a vacuum pump 1260 is used to evacuate the enclosure 1215 to a pressure from about 0.1 mTorr to about 500 mTorr, or more preferably from about 5 mTorr to about 100 mTorr, which are sufficient to allow photosensitizer (PS) diffusion to mitigate EUV shot noise.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:
1. A method for treating a substrate, comprising:
receiving the substrate, the substrate comprising:
an underlying layer on the substrate, and
a radiation-sensitive material layer on the underlying layer, the radiation-sensitive material layer comprising:
a first light wavelength activation threshold that controls the generation of acid to a first acid concentration in the radiation-sensitive material layer and controls generation of photosensitizer molecules in the radiation-sensitive material layer; and
a second light wavelength activation threshold that can excite the photosensitizer molecules in the radiation-sensitive material layer that results in the acid comprising a second acid concentration that is greater than the first acid concentration, the second light wavelength activation threshold being higher than the first light wavelength activation threshold;
exposing a first wavelength of light through a patterned mask onto the radiation-sensitive material layer to generate photo sensitizer molecules within the radiation-sensitive material layer, the first wavelength of light comprising a wavelength in the EUV spectrum that is at or above the first light wavelength activation threshold and lower than the second light wavelength activation threshold;
diffusing the photosensitizer molecules generated within the radiation-sensitive material layer to reduce the nonuniformity due to EUV shot noise in the radiation-sensitive material layer; and flood exposing a second wavelength of light to the radiation-sensitive material layer, the second wavelength of light being at or above the second light wavelength activation threshold.

2. The method of claim 1, further comprising:

optionally heating the substrate following the flood exposing a second wavelength of light;

developing the radiation-sensitive material layer; and etching, implanting, or modifying the underlying layer using the developed radiation-sensitive material layer as a mask.

3. The method of claim 1, wherein the step of diffusing photosensitizer molecules generated in the radiation-sensitive material layer comprises heating the substrate.

4. The method of claim 3, wherein heating the substrate comprises heating the substrate on a hot plate, using a convection heat source, or by exposure to electromagnetic radiation from an electromagnetic radiation source.

5. The method of claim 4, wherein the electromagnetic radiation comprises visible, UV, infrared, or microwave radiation, or a combination thereof.

6. The method of claim 4, wherein the electromagnetic radiation source is a broadband flash lamp, a light emitting diode; a laser, an ultraviolet (UV) flash lamp, or a microwave source.

7. The method of claim 3, wherein the substrate is heated to a temperature from about 30° C. to about 130° C., for no more than 120 seconds.

8. The method of claim 1, wherein the radiation-sensitive material layer further comprises a photoacid generator (PAG), wherein the photoacid generator (PAG) has a higher thermal activation energy than the thermal activation energy of the photosensitizer molecules.

9. The method of claim 1, wherein one or more parameters of the step of diffusing photosensitizer molecules generated in the radiation-sensitive material layer are optimized to improve line width roughness (LWR) associated with EUV shot noise while minimizing diffusion of acid generated in the step of exposing a first wavelength of light through a patterned mask.

10. The method of claim 1, wherein the step of diffusing photosensitizer molecules generated in the radiation-sensitive material layer comprises exposing the radiation-sensitive material layer to at least one of a liquid solvent or a solvent vapor.

11. The method of claim 10, wherein the solvent vapor comprises a solvent selected from the group consisting of n-methylpyrrolidone (NMP), dimethyl sulfoxide (DMSO), and dipropylene glycol dimethyl ether, isopropanol, or a mixture of two or more thereof.

12. The method of claim 10, wherein the liquid solvent comprises a solvent selected from the group consisting of propylene glycol monomethyl ether acetate (PGMEA), cyclohexanone, gamma butyrolactone, methyl amyl ketone, ethyl lactate, n-butyl acetate, methyl isobuytl ketone (MIBK), anisole, 2-heptanone, and an aqueous solution of tetra-methyl ammonium hydroxide (TMAH), water, methanol, 4-methyl-2-pentanol, isopropanol, ethanol, propanol, butanol, or a mixture of two or more thereof.

13. The method of claim 10, wherein the step of diffusing photosensitizer molecules generated in the radiation-sensitive material layer comprises a plurality of alternating exposures of the radiation-sensitive material layer to the liquid solvent and the solvent vapor.

14. The method of claim 10, wherein during the exposing the radiation-sensitive material layer to a solvent vapor, the substrate is maintained at a temperature from about 20° C. to about 100° C.

15. The method of claim 10, wherein during the exposing the radiation-sensitive material layer to a solvent vapor, the pressure is maintained from about 5 mTorr to about 100 mTorr.

16. The method of claim 10, wherein during the exposing the radiation-sensitive material layer to a solvent vapor, the pressure is maintained at the solvent saturated vapor pressure for the selected temperature during the exposing to the solvent vapor.

17. The method of claim 1, wherein the step of diffusing photosensitizer molecules generated in the radiation-sensitive material layer comprises exposing the radiation-sensitive material layer to a vacuum environment.

18. The method of claim 17, wherein the pressure of the vacuum environment is maintained from about 0.1 mTorr to about 500 mTorr.

19. The method of claim 17, wherein the pressure of the vacuum environment is maintained from about 5 mTorr to about 100 mTorr.

20. The method of claim 1, wherein the step of diffusing photosensitizer molecules generated in the radiation-sensitive material layer comprises inducing an increase of volume of the radiation-sensitive material layer by a release of a volatile chemical component of the radiation-sensitive material layer.

21. The method of claim 1, wherein the step of flood exposing a second wavelength of light to the radiation-sensitive material layer occurs prior to the radiation-sensitive material layer being developed.

22. The method of claim 1, wherein the step of diffusing photosensitizer molecules generated in the radiation-sensitive material layer does not cause loss of resolution due to diffusion of acid within the radiation-sensitive material layer.

* * * * *